United States Patent

Chao

[19]

[11] Patent Number: 6,033,951
[45] Date of Patent: Mar. 7, 2000

[54] PROCESS FOR FABRICATING A STORAGE CAPACITOR FOR SEMICONDUCTOR MEMORY DEVICES

[75] Inventor: Fang-Ching Chao, Hsinchu, Taiwan

[73] Assignee: United Microelectronics Corp., Taiwan

[21] Appl. No.: 08/735,563

[22] Filed: Oct. 23, 1996

[30] Foreign Application Priority Data

Aug. 16, 1996 [TW] Taiwan ............................ 85109990

[51] Int. Cl.$^7$ ............................................. H01L 21/8242
[52] U.S. Cl. ........................................ 438/253; 438/259
[58] Field of Search .................................. 438/238, 239, 438/253, 254, 396, 397

[56] References Cited

U.S. PATENT DOCUMENTS

| | | | |
|---|---|---|---|
| 5,071,783 | 12/1991 | Taguchi et al. | 438/254 |
| 5,077,688 | 12/1991 | Kumanoya et al. | 364/149 |
| 5,089,869 | 2/1992 | Matsuo et al. | 257/303 |
| 5,102,820 | 4/1992 | Chiba | 438/398 |
| 5,126,810 | 6/1992 | Gotou | 257/306 |
| 5,142,639 | 8/1992 | Kohyama et al. | 257/306 |
| 5,155,657 | 10/1992 | Oehrlein et al. | 361/313 |
| 5,158,905 | 10/1992 | Ahn | 438/396 |
| 5,164,337 | 11/1992 | Ogawa et al. | 438/254 |
| 5,172,201 | 12/1992 | Suizu | 257/308 |
| 5,196,365 | 3/1993 | Gotou | 438/254 |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 | 1/1993 | Japan . |
| 5-251657 | 9/1993 | Japan . |
| 2 252 447 | 8/1992 | United Kingdom . |

OTHER PUBLICATIONS

Ema et al., "3–Dimensional Stacked Capacitor Cell for 16$^M$ and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70.

"Mini–Trenches in Polysilicon For Dram Storage Capacitance Enhancement", IBM Technical Disclosure Bulletin, vol. 33, No. 9, Feb. 1991.

Ema et al., "3–Dimensional Stacked Capacitor Cell for 16M and 64M DRAMS", International Electron Devices Meeting, pp. 592–595, Dec. 1988.

*Primary Examiner*—Joni Chang
*Attorney, Agent, or Firm*—Rabin & Champagne P.C.

[57] ABSTRACT

A process for fabricating a DRAM semiconductor memory device having a transfer transistor and a storage capacitor with a tree-shaped electrode. The tree-shaped electrode is electrically coupled to a source/drain region of the transistor. The process includes forming a first insulation layer on the device substrate covering the transfer transistor. A first electrically conductive layer is formed over and penetrating the first insulation layer such that it is electrically coupled to the source/drain region. Cylindrical structures are formed on the first conductive layer, forming a recess between the cylindrical structures. A second insulation layer covering the cylindrical structures and a portion of the exposed first electrically conductive layer is formed, with the second insulation layer covering bottom portion of the recesses incompletely. A second electrically conductive layer covering the second insulation layer and the exposed portion of the first conductive layer is formed. Portions of the first and second conductive layers above the cylindrical structures are removed to section the conductive layers, forming tree-trunk and tree-limb portions of the tree-shaped electrode, respectively. The second insulation layer and the cylindrical structures are removed. A dielectric layer is formed over the sectioned first and second conductive layers. A third electrically conductive layer is formed over the dielectric layer, forming an opposing electrode of the capacitor.

48 Claims, 8 Drawing Sheets

U.S. PATENT DOCUMENTS

| | | | |
|---|---|---|---|
| 5,206,787 | 4/1993 | Fujioka | 257/307 |
| 5,266,512 | 11/1993 | Kirsch | 438/253 |
| 5,274,258 | 12/1993 | Ahn | 257/308 |
| 5,338,955 | 8/1994 | Tamura et al. | 257/306 |
| 5,354,704 | 10/1994 | Yang et al. | 365/149 |
| 5,371,701 | 12/1994 | Lee et al. | 365/149 |
| 5,389,568 | 2/1995 | Yun | 438/396 |
| 5,399,518 | 3/1995 | Sim et al. | 438/396 |
| 5,438,011 | 8/1995 | Blalock et al. | 438/396 |
| 5,443,993 | 8/1995 | Park et al. | 438/396 |
| 5,453,633 | 9/1995 | Yun | 257/306 |
| 5,459,094 | 10/1995 | Jun | 437/52 |
| 5,460,996 | 10/1995 | Ryou | 438/254 |
| 5,478,768 | 12/1995 | Iwasa | 438/396 |
| 5,478,770 | 12/1995 | Kim | 438/253 |
| 5,482,886 | 1/1996 | Park et al. | 438/397 |
| 5,508,222 | 4/1996 | Sakao | 438/396 |
| 5,521,419 | 5/1996 | Wakamiya et al. | 257/394 |
| 5,523,542 | 6/1996 | Chen et al. | 438/396 |
| 5,543,346 | 8/1996 | Keum et al. | 438/397 |
| 5,550,080 | 8/1996 | Kim | 438/397 |
| 5,561,309 | 10/1996 | Cho et al. | 257/306 |
| 5,561,310 | 10/1996 | Woo et al. | 257/306 |
| 5,572,053 | 11/1996 | Ema | 257/296 |
| 5,595,931 | 1/1997 | Kim | 438/387 |

PROCESS FOR FABRICATING A STORAGE CAPACITOR FOR SEMICONDUCTOR MEMORY DEVICES

BACKGROUND OF THE INVENTION

1. Field of the Invention

The invention relates in general to a semiconductor memory device having capacitors, and in particular to a dynamic random-access memory (DRAM) semiconductor device. More particularly, the invention relates to the semiconductor structural configuration of a memory cell unit for a DRAM device featuring a transfer transistor and a tree-type storage capacitor, and to the process for fabricating the capacitor.

2. Technical Background

Semiconductor memory devices such as DRAMs include arrays of memory cell units for the storage of digital information in binary form. Each of the DRAM memory cells in the typical device memory array in particular includes a transistor and a capacitor for the storage of one bit of binary data. FIG. 1 of the accompanying drawings is a schematic diagram of such a DRAM memory cell unit. The schematic diagram shows that the typical memory cell includes a transfer transistor T and a storage capacitor C.

The transistor T functions as an electronic switch that transfers the binary data to be stored in or retrieved from the memory in the cell unit of FIG. 1 by connecting the cell to the external data circuitry. The memory cell unit stores the binary data as a logical high or low represented respectively by either a charged or discharged status of the storage capacitor C. To implement this, the source of the transfer transistor T is connected to the bit line BL of the memory array, and the drain thereof to one electrode 6 of the storage capacitor C. The other of the pair of capacitor electrodes, 8, is tied to the ground plane of the entire system. As is well known, the storage dielectric layer 7 directly affects the capacitance of the storage capacitor C. The gate of the transfer transistor T is connected to the word line WL of the memory cell array system, which is controlled to enable charging of the storage capacitor C when the memory cell unit is accessed.

In conventional 1 mega-byte (1 MB) DRAM devices, storage capacitors having a substantially two-dimensional capacitor structural configuration, generally known as a planar-type capacitor, are utilized as the storage capacitors for the memory cell. However, planar-type capacitors take up considerable integrated circuit die surface area, which is a disadvantageous factor constraining the miniaturization of the fabricated memory device. For high-density DRAM devices, 4 MB and greater for example, a planar-type storage capacitor structure becomes unsuitable, since the device fabrication resolution is increased to such a level that the storage capacitor does not have sufficient capacitance to hold enough electric charge for practical DRAM operational needs. Three-dimensional storage capacitor structural configurations would have to be used to increase the capacitor electrode surface area within the limited device die surface area assigned for each of the memory cell units. For this reason, DRAM memory cell storage capacitor structural configurations such as the stacked type or trench type were introduced.

Although stacked or trench type capacitors may have increased capacitance compared with the planar type for comparable assigned device die surface area, they still cannot provide sufficient practical capacitance for DRAM devices featuring even higher storage densities in the range of, for example, 64 MB per device or greater. In other words, simple three-dimensional capacitor structural configurations are no longer sufficient.

One proposed solution for increasing storage capacitor capacitance is the so-called fin-type stacked configuration. For example, Ema et al. proposed one such capacitor structural configuration in the paper "3-dimensional Stacked Capacitor Cell for 16M and 64M DRAMs," International Electron Devices Meeting, pp. 592–595, December 1988. Essentially, a fin-type configuration makes use of a number of stacked layers to increase storage capacitor electrode surface area. Further examples of this fin-type storage capacitor structural configuration are disclosed in U.S Pat. Nos. 5,071,783; 5,126,810; 5,196,365; and 5,206,787.

An additional type of storage capacitor structure for DRAM memory cell unit is the cylindrically-stacked type configuration. Wakamiya et al. described an example of this type of capacitor structure in the paper "Novel Stacked Capacitor Cell for 64-MB DRAM," 1989 Symposium on VLSI Technology Digest of Technical Papers, pp. 69–70. This is a structure built around a dielectric layer sandwiched between the electrodes, which extends in the form of a vertical cylinder to increase capacitor electrode surface area. U.S. Pat. No. 5,077,688 describes such a capacitor structure.

However, as the level of integration of semiconductor devices continues to increase, DRAM memory cells become ever smaller in dimension. As persons skilled in the art are well aware, storage capacitors sharing smaller surface areas in the semiconductor substrate in which they are fabricated suffer decreased capacitance. One of the direct results is that the DRAM performance characteristics are degraded by an increase in soft error probability, due to α particle irradiation. Thus, efforts to increase DRAM memory cell storage capacitor capacitance by enlarging the capacitor electrode surface area physically, despite the trend of device miniaturization, remains one of the major problems for fabricating larger DRAM memory devices.

SUMMARY OF THE INVENTION

It is therefore an object of the invention to provide a process for fabricating a semiconductor memory device having a tree-shaped electrode structural configuration for the storage capacitor, which provides increased electrode surface area.

The invention achieves the above-identified object by providing, in accordance with a first preferred embodiment of the invention, a process of fabricating a DRAM semiconductor memory device having a memory cell storage capacitor with tree-shaped electrodes, providing an increased surface area. The semiconductor memory device is fabricated over the surface of a semiconductor substrate and includes a transfer transistor, and a storage capacitor having one of the electrodes thereof electrically coupled to one of the source/drain regions of the transistor. The process includes first forming a first insulation layer over the device substrate, covering the transfer transistor. A first electrically conductive layer is then formed on the first insulation layer and penetrating the first insulation layer, to electrically couple to one of the source/drain regions of the transfer transistor. Cylindrical structures are then formed over the first electrically conductive layer, forming recesses between the cylindrical structures. A second insulation layer covering the cylindrical structures and the exposed surface of the first electrically conductive layer is then formed, only partially covering the portion of the first conductive layer at the bottom of the recesses. A second electrically conductive layer covering the second insulation layer and the exposed portion of the first conductive layer is then formed. Portions of the first and second electrically conductive layers above the cylindrical structures are then removed to section the conductive layers. The second insulation layer and the cylindrical structures are then removed. A dielectric layer is then formed over the sectioned first and second electrically conductive layers. A third electrically conductive layer is then formed over the dielectric layer. The sectioned first electrically conductive layer forms a tree-trunk portion of a tree-shaped electrode of the storage capacitor, and the sectioned second electrically conductive layer forms a tree-limb portion of the tree-shaped electrode. The sectioned first and second electrically conductive layers together form one of the two storage capacitor electrodes, and the third electrically conductive layer forms the other electrodes.

According to another aspect of the invention, the tree-trunk portion of the storage capacitor electrode has a T-shaped cross-section.

According to still another aspect of the invention, the tree-limb portion of the storage capacitor electrode has a cross-section having multiple bends.

According to yet another aspect of the invention, the tree-limb portion of the storage capacitor electrode includes first, second, third, and fourth sections. The first section extends horizontally over the tree-trunk portion of the storage capacitor electrode for a first distance. The second section extends vertically from an end of the first section for a second distance. The third section extends horizontally from an end of the second section for a third distance. The fourth section extends vertically from an end of the third section for a fourth distance.

BRIEF DESCRIPTION OF THE DRAWING

Other objects, features, and advantages of the invention will become apparent by way of the following detailed description of the preferred but non-limiting embodiments. The description is made with reference to the accompanying drawings in which.

DETAILED DESCRIPTION OF THE PREFERRED EMBODIMENTS

Preferred embodiments of the invention are described in detail as follows, with reference to the accompanying drawings. It should be pointed out that the cross-sectional views are schematics used to describe the invention and are not necessarily drawn to an exact scale. The cross-sectional views are drawn to show exemplary structures of the invention rather than to limit the invention to a particular storage capacitor structure.

Figure 1:
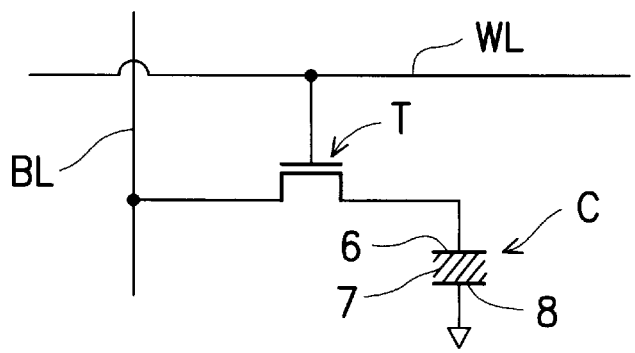
FIG. 1 is a schematic diagram of a conventional DRAM memory cell.
Figure 2A:
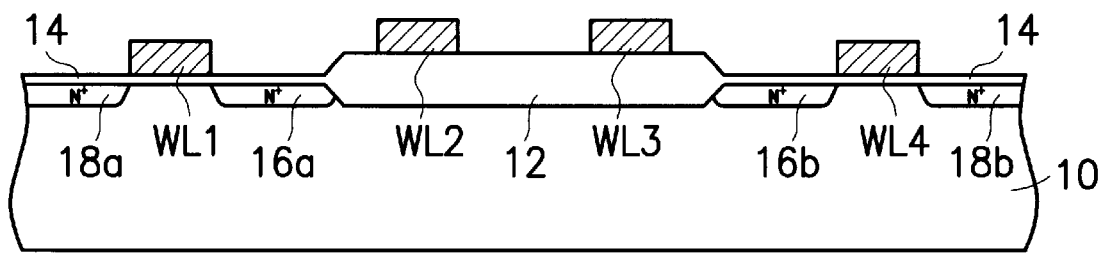
FIGS. 2A through 2E are cross-sectional views of a DRAM memory cell, depicting fabrication process stages in accordance with a first preferred embodiment of the invention.

Refer to FIGS. 2A through 2E for a description of a DRAM memory cell storage capacitor having a tree-type structure, in accordance with a first embodiment of the invention. As shown in the drawing, the surface of the silicon substrate 10 of FIG. 2A is subject to a thermal oxidation to form a field oxide layer 12 having a thickness of about 3,000 Å. This can be performed, for example, in a LOCOS (local oxidation of silicon) procedure, which is conventional in the art. After the formation of the field oxide layer 12, another thermal oxidation procedure may be applied to the substrate 10 to form a gate oxide layer 14 having a thickness of about 150 Å. CVD (chemical vapor deposition) or LPCVD (low-pressure CVD) is then performed, in order to deposit a polysilicon layer having a thickness of about 2,000 Å over the surface of the entire substrate 10. To improve the electrical conductivity of the deposited polysilicon layer, ions such as phosphorus can be implanted therein. Preferably, a refractory metal layer may be further deposited and then annealed to form a polycide layer for substantially improved electrical conductivity. Tungsten may preferably be used as the refractory metal, deposited to a thickness of about 2,000 Å. Afterwards, a conventional photolithographic and etching procedure may be used to define patterns over the surface of the formed polycide layer, followed by a controlled etching procedure, to form the word lines WL1 through WL4 in the polycide layer, as shown in the cross-sectional view of FIG. 2A. An additional ion implantation procedure then follows to implant ions such as arsenic into the silicon substrate 10, thereby forming the sources 16a and 16b and drains 18a and 18b for the memory cell transistor. Word lines WL1 through WL4 serve as shielding layers in the ion implantation process, which is performed at an energy level of about 70 KeV and results in an ion concentration of about $1\times10^{15}$ atoms/cm$^2$.

Figure 2B:
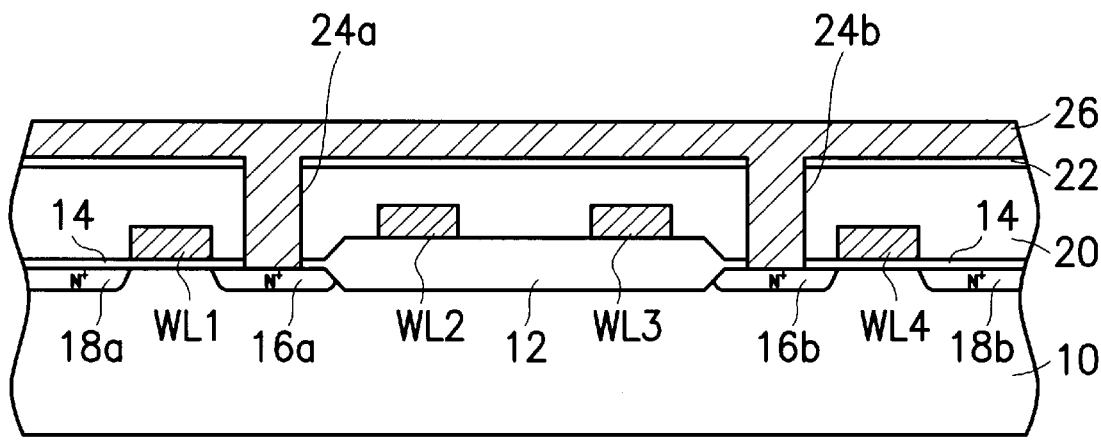

Then, as shown in FIG. 2B, CVD is performed to deposit an insulation layer 20 of, for example, BPSG (borophosilicate glass) having a thickness of about 7,000 Å, over the surface of the device substrate. Another CVD is then performed to deposit an etching protection layer 22 of, for example, silicon nitride having a thickness of about 1,000 Å. Conventional photolithographic and etching procedures may then be performed to etch into the protection layer 22, the insulation layer 20, and the gate oxide layer 14, to pattern the respective layers to form storage electrode contact holes 24a and 24b. These contact holes extend through all the etched layers, starting from the top surface of the etching protection layer 22 and continuing to the surface of the source regions 16a and 16b, as shown in the cross-sectional view of FIG. 2B. After the formation of the contact holes 24a and 24b, a polysilicon layer 26 is deposited by CVD over the surface of the substrate, including in the contact holes. As shown in the drawing, the deposited polysilicon layer 26 fills the internal space of the holes 24a and 24b. An additional ion implantation procedure may then be performed to improve the electrical conductivity of the deposited polysilicon layer 26. In this procedure, arsenic ions, for example, can be implanted.

Figure 2C:
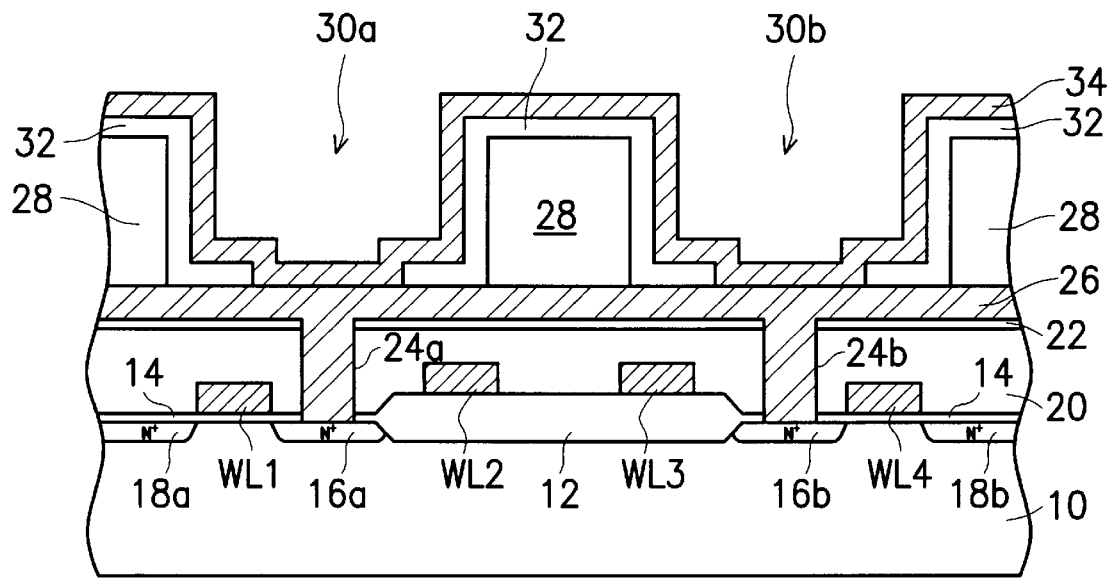

Referring next to FIG. 2C, CVD may then be performed to deposit an insulation layer on the surface of the polysilicon layer 26. This insulation layer may be a silicon dioxide layer having a thickness of about 7,000 Å. A conventional photolithographic and etching procedure then follows to pattern insulation pillars 28 from the deposited insulation layer, in the form of cylindrical structures. Among these formed insulation pillars 28, large recesses, such as those identified by reference numerals 30a and 30b, are formed, preferably above the surface of the respective drain regions 16a and 16b of the fabricated memory cell transistor. CVD is then performed to deposit another insulation layer 32 covering the exposed surfaces of both the insulation pillars 28 and the polysilicon layer 26. Preferably, the deposited insulation layer 32 is a silicon dioxide layer, or may be any other similar material layer such as a silicon nitride layer, and preferably has a thickness of about 1,000 Å. A conventional photolithographic and etching procedure is then performed to define and pattern the insulation layer 32, removing portions of the insulation layer 32 inside the recesses 30a and 30b. CVD is then further performed to deposit a polysilicon layer 34 over the exposed surface of the insulation layer 32 and the polysilicon layer 26. The deposited polysilicon layer 34 may have a thickness of about 1,000 Å. Preferably, electrical conductivity of the deposited polysilicon layer 34 is improved by an ion implantation procedure, implanting ions such as arsenic therein.

Figure 2D:
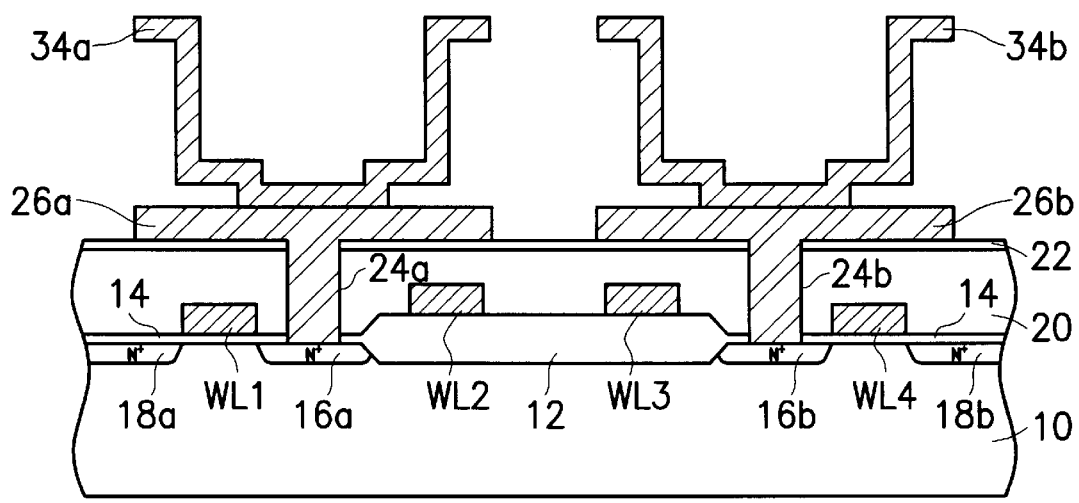

As is shown in FIG. 2D, the polysilicon layers 34 and 26 are defined and patterned using a conventional photolithographic and etching procedure. This patterning procedure shapes and forms one of the electrodes for the storage capacitor of the memory cell unit. In this procedure, the polysilicon layers 34 and 26 are divided into sections, such as are identified in the drawing by reference numerals 34a, 34b and 26a, 26b. This may be accomplished, for example, by etching through the polysilicon layer 34, the insulation layer 32, the insulation pillar 28, and the polysilicon layer 26 in succession. After the polysilicon layers 34 and 26 are sectioned as described above, a wet etching procedure is then performed to remove the remainder of the insulation layers 32 and 28 internal to the space between the sectioned polysilicon layers 34a and 34b. The etching is controlled to remove the insulation layers 32 and 28 completely, until the surface of the etching protection layer 22 is exposed. Alternatively, the polysilicon layer 34 may first be patterned into sections. The insulation layer 32 and insulation pillar 28 may then be removed, and the polysilicon layer 26 may then be sectioned.

At this stage, the sectioned polysilicon layers 34a and 34b, as shown in FIG. 2D, have bottom surfaces thereof in contact with the top surfaces of the sectioned polysilicon layers 26a and 26b, respectively. This forms a combined electrically conductive structure having a shape resembling that of a tree. Bottom portions of the sectioned polysilicon layers 34a and 34b are thus combined with the sectioned polysilicon layers 26a and 26b, respectively. As shown in the drawing of FIG. 2D, each of the sectioned polysilicon layers 26a and 26b has a T-shaped cross-sectional configuration and extends downward into the depth of the substrate 10, reaching the respective drain regions 16a and 16b of the memory cell transistors. When coupled with the corresponding bottom portion of the sectioned polysilicon layers 34a and 34b directly above them, the T-shaped sectioned polysilicon layers 26a and 26b each form a tree trunk portion of the tree-shaped storage capacitor electrode shown in the drawing. The raised portion of the sectioned polysilicon layers 34a and 34b extending above the surface of the substrate 10, form the tree limbs of the tree-shaped structure of the storage electrode. Such a tree-shaped storage electrode structural configuration is characterized by the multiple bendings of the tree-limb portions. For example, the tree-limb portion of the configuration, namely the sectioned polysilicon sections 34a and 34b, may be by analogy considered to be "growing" vertically upward from the interfacing boundary with the sectioned polysilicon layers 26a and 26b and then extending outward in a horizontal direction. The structure then rises upward again, followed by another outward extension. A total of four sections thus constitute each of the two symmetrical tree limbs portions in this embodiment.

Figure 2E:
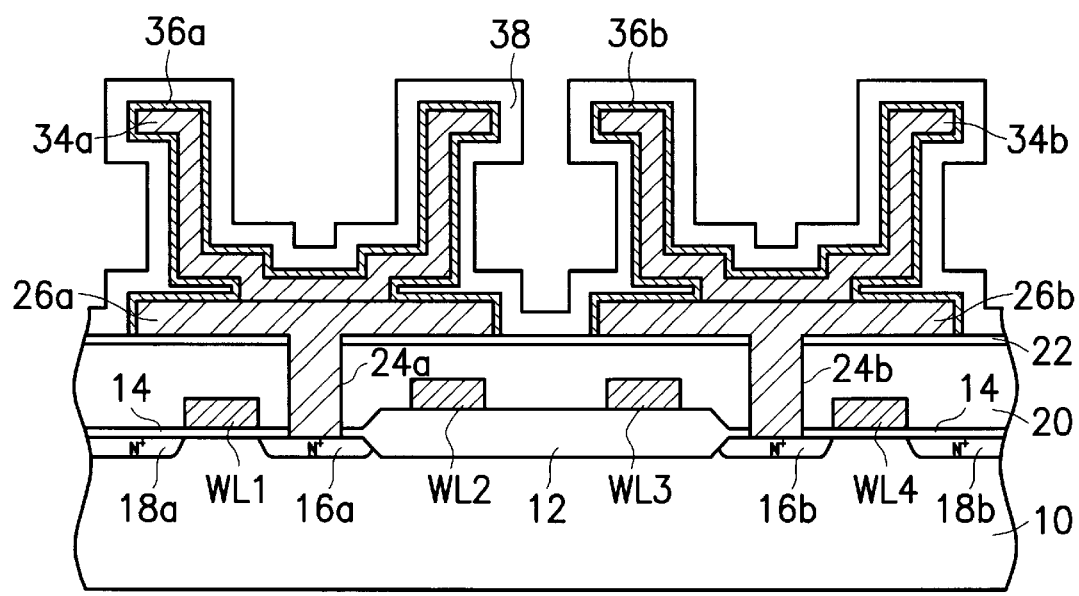

Exposed exterior surfaces of the sectioned polysilicon layers 26a, 34a, 26b and 34b, when combined as a whole to form the respective storage electrodes for the memory cell storage capacitors, are covered with a respective layer of dielectric material 36a, 36b, as shown in FIG. 2E. The covering dielectric layers 36a or 36b may be silicon dioxide, an NO (nitride/oxide) or ONO (oxide/nitride/oxide) silicon structure, or any other applicable layer that is suitable for use as the capacitor dielectric layer. After the formation of the storage capacitor dielectric layers 36a and 36b, a further polysilicon layer 38 is formed over the exposed surface of the dielectric layers 36a and 36b. Essentially, this polysilicon layer 38 is the second of the two capacitor electrodes. Formation of this second electrode, having a thickness of about 1,000 Å, may include first depositing a polysilicon layer by, for example, CVD. The deposited polysilicon layer may be subject to N-type impurity implantation to improve the electrical conductivity of the layer. A conventional photolithographic and etching procedure may then follow to define and pattern this polysilicon layer into the necessary configuration, as shown in FIG. 2E, so that it may serve as the second electrode for the fabricated storage capacitors of the DRAM memory cell unit.

At this stage, fabrication of the storage capacitor can be considered to be substantially complete, at least for the purpose of the description of the invention, although in practical DRAM device fabrication, subsequent process steps are required, as persons skilled in the art appreciate. For example, although not shown in detail in the drawing of FIG. 2E, persons skilled in the art are aware that subsequent fabrication process steps, including the fabrication of bit lines, bonding pads, interconnections, and passivations, as well as the final packaging of the fabricated memory array, are necessary for the fabrication of a complete DRAM semiconductor memory device. As these fabrication details are not within the scope of the invention, they are not described herein.

In the above-described first preferred embodiment of the invention, the storage electrodes include a single layer, multiple-bending tree-limb structure. However, as persons skilled in the art will appreciate, storage electrodes including multiple layers of electrically conductive materials are contemplated. The second preferred embodiment, to be described below, has a storage electrode that includes two layers having multiple-bending tree-limb configurations. For a description of this embodiment, refer to FIGS. 3A and 3B of the drawings.

Figure 3A:
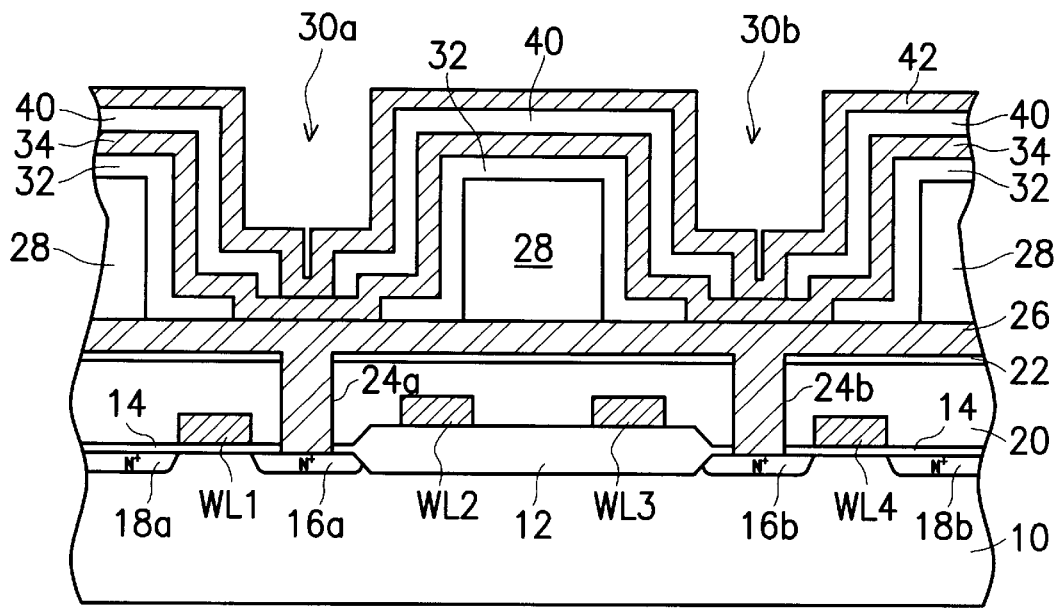
FIGS. 3A and 3B are cross-sectional views of a DRAM memory cell, depicting fabrication process stages in accordance with a second preferred embodiment of the invention.
Figure 3B:
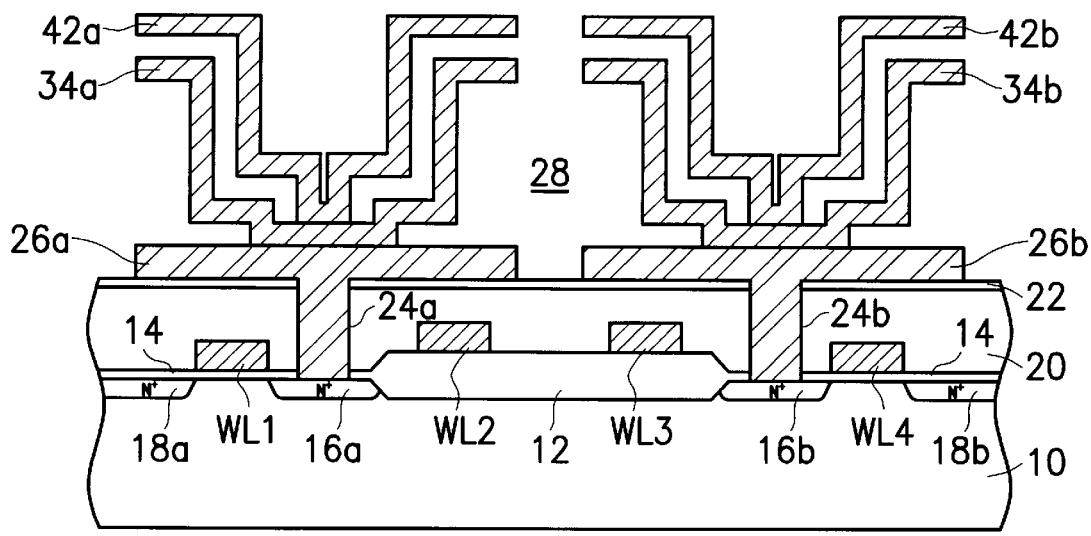

It should be noted that the tree-type storage capacitor structural configuration of the embodiment depicted in FIGS. 3A and 3B is based on a semiconductor foundation similar to that of the first embodiment shown in FIGS. 2A–2E. Essentially, the capacitors are fabricated according to the same procedural steps as that of FIGS. 2A–2C until the structure depicted in FIG. 2C is constructed. After that stage, different procedural steps are performed to form the DRAM memory cell storage electrodes featuring multiple-layered storage electrodes. Thus, for the purpose of clarity and simplicity, the same or equivalent structural portions of the memory cell configuration of the second embodiment are designated by the same reference numerals as those of the first embodiment described above with reference to FIGS. 2A–2E.

After the deposition of the polysilicon layer 34, an additional insulation layer 40 is further deposited by, for example, CVD to a thickness of about 1,000 Å, as shown in FIG. 3A. This deposited insulation layer 40 may be a layer of silicon dioxide, nitride, or any other suitable material, although a silicon dioxide layer is considered to be best in the case of this embodiment. Then, with both the polysilicon layer 34 and the insulation layer 40 covering the surface of the device at this stage, a photolithographic and etching procedure is performed to remove portions of the insulation layer 40 in the area on the bottom of the recesses 30a and 30b, exposing a portion of the polysilicon layer 34. Then CVD is performed to deposit a layer of polysilicon 42 over the surface of the insulation layer 40 and the exposed portion of the polysilicon layer 34. The deposited polysilicon layer 42 in this case has a thickness of about 1,000 Å. Further ion implantation may then follow to implant, for example, arsenic ions into the deposited polysilicon layer 42, in order to improve electrical conductivity therein.

Then, as shown in FIG. 3B, a conventional photolithographic and etching procedure is utilized to define patterns in the polysilicon layers 42, 34, and 26 and form the storage electrodes for the capacitors of the memory cell units. Essentially, as shown in the cross-sectional view of FIG. 3B, the polysilicon layers 42, 34, and 26 are divided into the independent sections 42a and 42b, 34a and 34b, and 26a and 26b, respectively. A wet etching procedure then follows to remove the insulation layers 28, 32, and 40 completely, so that the surface of the etching protection layer 22 is exposed. At this point, the storage electrodes for the memory cell capacitors are formed in the shape shown in the cross-sectional view of FIG. 3B. Bottom surfaces of the sectioned polysilicon layers 42a, 42b directly contact the top surfaces of the sectioned polysilicon layers 34a and 34b, respectively, while bottom surfaces of layers 34a and 34b directly contact the top surface of the sectioned polysilicon layers 26a and 26b, respectively. The combination of these three sectioned polysilicon layers forms the tree-shaped electrically conducting electrode for the DRAM memory cell storage capacitors. As in the previous embodiment, the sectioned polysilicon layers 42a and 34a form the tree-limb portions of the tree-shaped capacitor electrode. These portions are generally parallel to each other. Together with the tree-trunk portion of the configuration, namely the sectioned layer 26a, having a T-shaped cross section, a tree-shaped storage capacitor electrode is thus formed. The raised portions of the sectioned polysilicon layers 42a, 42b and 34a, 34b extending above the surface of the substrate 10 are the tree-limbs of the tree-shaped structure of the storage electrodes. This tree-shaped storage electrode structural configuration is characterized by multiple bendings of the tree-limb portions. For example, the tree-limb portion of the configuration, namely the sectioned polysilicon sections 42a, 42b and 34a, 34b, may be by analogy considered to be "growing" vertically upward from the sectioned polysilicon layers 26a and 26b and then extending outward in a horizontal direction. The structure then rises upward again, followed by another outward extension. A total of four sections thus form each of the two symmetrical tree limbs portions in this embodiment.

As in the first embodiment of the invention, exposed exterior surfaces of the sectioned polysilicon layers 26a, 34a, 42a, 26b, 34b, and 42b are then covered with a layer of dielectric material. After the formation of the storage capacitor dielectric layer, a further polysilicon layer is formed over the exposed surface of the dielectric layer. This further polysilicon layer is the second of the two capacitor electrodes. At this stage, fabrication of the storage capacitor can be considered to be substantially complete, at least for the purpose of the description of the invention, although in a practical DRAM device fabrication, subsequent process steps are required, as persons skilled in the art appreciate. Because these fabrication details are not within the scope of the invention, they are not described herein.

Further, as persons skilled in the art will appreciate, to construct storage capacitor electrodes having more tree-limb layer sections than those in the first and second embodiments, additional procedural steps of forming insulation layers and polysilicon layers similar to layers 40 and 42 of the above-described second embodiment can be performed before patterning to shape the capacitor electrode. Meanwhile, tree-limb sections of the capacitor electrodes having a structural configuration different from those exemplified in the first and second preferred embodiments of the invention can also be adopted. For example, the tree-limb sections may rise above the tree-trunk portion of the structure before extending outwardly.

Figure 4A:
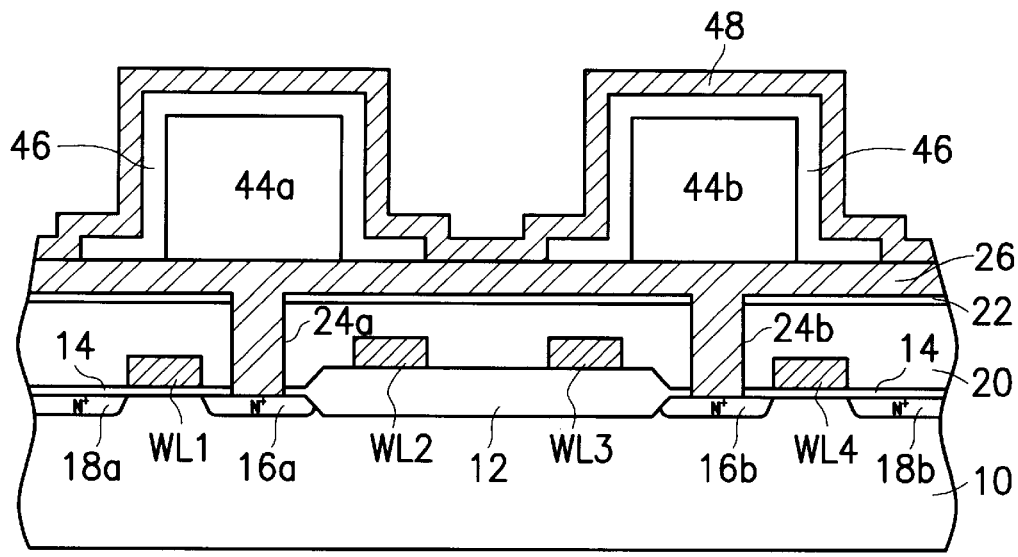
FIGS. 4A and 4B are cross-sectional views of a DRAM memory cell, depicting fabrication process stages in accordance with a third preferred embodiment of the invention.
Figure 4B:
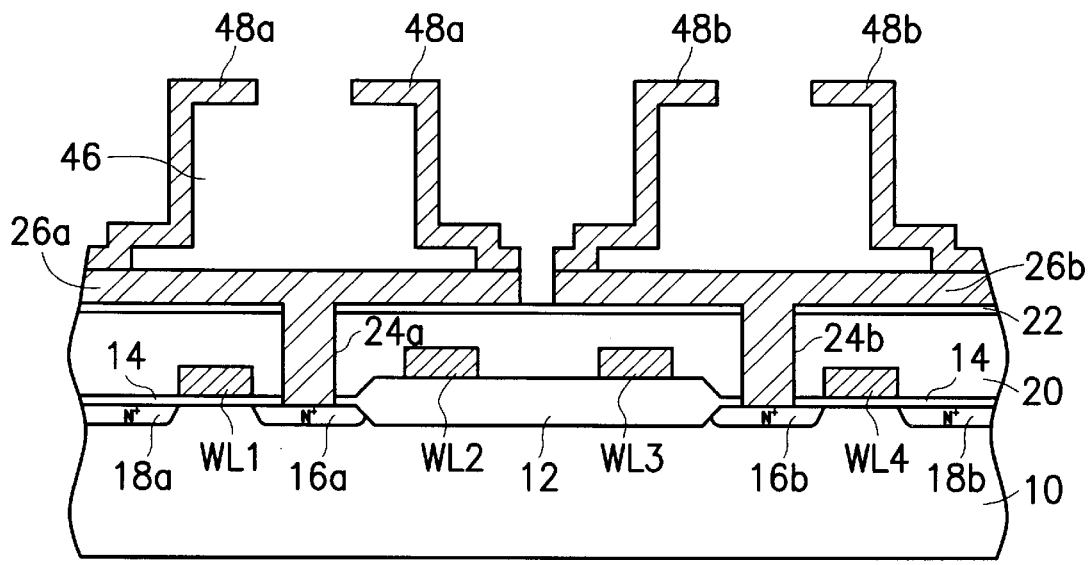

A third preferred embodiment of the invention is now described, with reference to FIGS. 4A and 4B. It should be noted again that the tree-type storage capacitor structural configuration of the embodiment depicted in FIGS. 4A and 4B is based on a semiconductor foundation similar to that of the first embodiment shown in FIGS. 2A–2E. Essentially, the capacitor is fabricated following the same procedural steps shown in FIGS. 2A–2B until the structure depicted in FIG. 2B is formed. Further to that step, additional procedural steps are then performed to form DRAM memory cell storage electrodes featuring multiple-layered storage electrodes. For the purpose of both clarity and simplicity, the same or equivalent structural portions of the memory cell configuration of this third described embodiment are designated by the same reference numerals as those of the first embodiment described above with reference to FIGS. 2A–2E.

Thus, after the deposition of the polysilicon layer 26 shown in the cross-sectional view of FIG. 2B, an additional insulation layer, a silicon dioxide layer having a thickness of about 7,000 Å for example, is formed by, for example, CVD. A conventional photolithographic and etching procedure is performed to etch into the deposited insulation layer so as to form the cylindrical insulation configurations 44a and 44b, as depicted in the cross-sectional view of FIG. 4A. These cylindrically-shaped insulation layers 44a and 44b are preferably located directly above the memory cell transistor drain regions 16a and 16b, respectively. After the formation of the insulation cylinders 44a and 44b, another insulation layer 46, having a thickness of about 1,000 Å, is formed by CVD, covering both the insulation cylinders 44a and 44b, as well as the exposed surface of the polysilicon layer 26. The insulation layer 46 may be a silicon dioxide layer, a silicon nitride layer, or any other insulation layer of suitable material, and is preferably a silicon dioxide layer. A conventional photolithographic and etching procedure is then utilized to pattern the insulation layer 46 to expose portions of the polysilicon layer 26 between the insulating cylinders 44a and 44b. Then, another polysilicon layer 48 is deposited by CVD to cover both the insulation layers 46 and the exposed portions of the polysilicon layer 26. The deposited polysilicon layer 48 may have a thickness of about 1,000 Å. An ion implantation procedure may be performed to implant, for example, arsenic ions in order to improve the electrical conductivity of the polysilicon layer 48.

Then, proceeding to FIG. 4B, a conventional photolithographic and etching procedure is performed to pattern the polysilicon layers 48 and 26, so as to define the electrodes for the DRAM memory cell storage capacitors. In other words, the polysilicon layers 48 and 26 are sectioned into portions 48a, 48b and portions 26a and 26b, respectively. A wet etching procedure then follows to completely remove the insulation layers 46, 44a, and 44b. Portions of the polysilicon layers 48 and 28 between the insulating layer areas are removed such that the surface of the etching protection layer 22 is exposed. The polysilicon layers 48a and 48b, and 26a and 26b that remain, as shown in FIG. 4B, now form one of the electrodes of the respective storage capacitors. In a manner similar to that described above for the previous embodiments, the polysilicon layers 26a and 26b form the tree-trunk portion of the tree-shaped storage electrodes, which are electrically respectively connected to the drain regions 16a and 16b of the DRAM memory cell transistors. Again, each of the tree-trunk portions 26a and 26b has a T-shaped cross-section, as shown in the drawing.

At this point, the storage electrodes for the memory cell capacitors have been formed into the shape shown in the cross-sectional view of FIG. 4B. The bottom edges of the sectioned polysilicon layers 48a, 48b connect directly to the top surfaces of the sectioned polysilicon layers 26a and 26b. The combination of these sectioned polysilicon layers forms the tree-shaped electrically conducting electrodes for the DRAM memory cell storage capacitors. In a manner similar to that of the previous embodiments, the sectioned polysilicon layers 48a and 48b form the tree-limb portion of the tree-shaped capacitors. Together with the tree-trunk portion of the configuration, namely the sectioned layers 26a and 26b having T-shaped cross sections, tree-shaped storage capacitor electrodes are thus formed. The raised portions of the sectioned polysilicon layers 48a and 48b extending above the surface of the substrate 10 are the tree-limbs of the tree-shaped structure of the storage electrodes. Such a tree-shaped storage electrode structural configuration is characterized by the multiple bendings of the tree-limb portions. For example, the tree-limb portion of the configuration, namely the sectioned polysilicon sections 48a, and 48b, may be by analogy considered to be "growing" vertically upward from the respective sectioned polysilicon layers 26a and 26b and then extending inward in a horizontal direction. The structure then rises upward again, followed by another inward extension. A total of four sections thus form each of the two symmetrical tree limbs in this embodiment.

Similar to the previously-described embodiments of the invention, exposed exterior surfaces of the sectioned polysilicon layers 26a, 48a, 26b, and 48b are covered with a layer of dielectric material. After the formation of the storage capacitor dielectric layer, a further polysilicon layer is formed over the exposed surface of the dielectric layer. This further polysilicon layer is the second of the two capacitor electrodes. At this stage, fabrication of the storage capacitors is substantially complete, at least for the purpose of the description of the invention, although in a practical DRAM device fabrication, subsequent process steps are still required, as persons skilled in the art appreciate. Because these fabrication steps are not within the scope of the invention, they are not described herein.

In the above-described embodiments of the invention, the storage electrodes are made up of substantially symmetrical tree-limb sections, as viewed in cross-section. The invention, however, is not restricted to such configurations, as persons skilled in the art should well be aware. The fourth embodiment, to be described below, has a DRAM memory cell storage capacitor electrode that includes one tree-limb structure for the configuration. For a description of such an embodiment, refer to FIG. 5 of the drawing.

Figure 5:
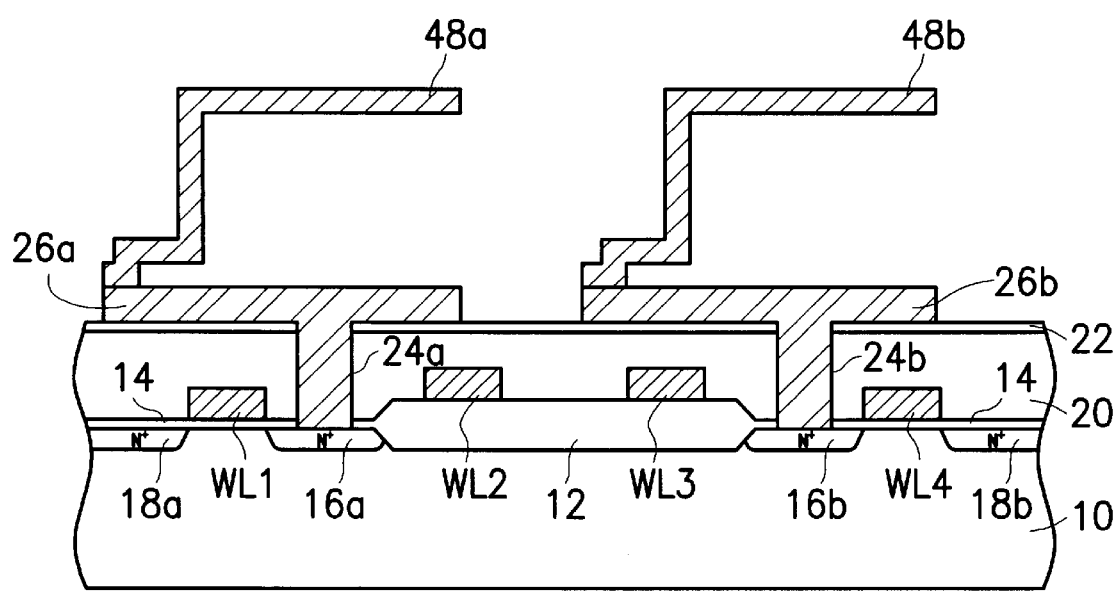
FIG. 5 is a cross-sectional view of a DRAM memory cell, depicting fabrication process stages in accordance with a fourth preferred embodiment of the invention.

It should be noted that the tree-type storage capacitor structural configuration of the embodiment depicted in FIG. 5 is based on a semiconductor foundation similar to that of the third embodiment described with reference to FIGS. 4A–4B. Essentially, the capacitor is fabricated according to the same procedural steps as those shown in FIGS. 4A–4B, until the structure depicted in FIG. 4B is obtained. Further to that stage, different procedural steps are performed to form DRAM memory cell storage electrodes featuring one single tree-limb structure for the tree-shaped capacitor electrode. For clarity and simplicity, the same or equivalent structural portions of the memory cell configuration of this embodiment are designated by the same reference numerals as those of the third embodiment described above with reference to FIG. 4A.

After deposition of the polysilicon layer 48 as shown in FIG. 4A, a conventional photolithographic and etching procedure is performed to pattern the polysilicon layers 48 and 26 so as to define the electrodes for the DRAM memory cell storage capacitors being fabricated. The polysilicon layers 48 and 26 are sectioned into independent portions 48a and 48b, and 26a and 26b, respectively, wherein each of the sectioned polysilicon layers 48a and 48b is connected to a corresponding sectioned layer 26a and 26b at one end, as shown in the cross-sectional view of FIG. 5. In a manner similar to that utilized in the previous embodiments, a wet etching procedure may then be performed to remove the insulation layers 46, 44a, and 44b, until the surface of the etching protection layer 22 is exposed. The polysilicon layers 48a and 48b, and 26a and 26b that remain, as shown in FIG. 4B, now each form one of the respective electrodes of the DRAM memory cell storage capacitors. Similar to the previous embodiments, the polysilicon layers 26a and 26b form the tree-trunk portion of the tree-shaped storage electrode, and are electrically connected, respectively, to the drain regions 16a and 16b of the DRAM memory cell transistors. Again, each of the tree-trunk portions 26a and 26b has a T-shaped cross-section, as shown in the drawing.

At this point, the storage electrode for the memory cell capacitor has been formed into the shape shown in the cross-sectional view of FIG. 5. The bottom edges of the sectioned polysilicon layers 48a, 48b connect directly with the top surfaces of the sectioned polysilicon layers 26a and 26b, respectively. The combination of these sectioned polysilicon layers forms the tree-shaped electrically conducting electrodes for the DRAM memory cell storage capacitors. Similar to the previous embodiments, the sectioned polysilicon layers 48a and 48b are the single-sided tree-limb portions of the tree-shaped capacitors. Together with the tree-trunk portions of the configuration, namely sectioned layers 26a and 26b having T-shaped cross sections, tree-shaped storage capacitor electrodes are thus formed. Raised portions of the sectioned polysilicon layers 48a and 48b extending above the surface of the substrate 10 resemble tree-limbs of the overall tree-shaped structure of the storage electrode. Such a tree-shaped storage electrode structural configuration is characterized by multiple bendings of the tree-limb portion. For example, the tree-limb section of the configuration, namely the sectioned polysilicon sections 48a, and 48b, may be by analogy considered to be "growing" vertically upward from the sectioned polysilicon layers 26a and 26b and then extending in a horizontal direction. The structure then rises upward again, followed by another single-side extension. A total of four sections thus forms each of the tree-limb sections in this embodiment.

Similar to the previously-described embodiments of the invention, exposed exterior surfaces of the sectioned polysilicon layers 26a, 48a, and 26b, 48b are covered with layers of dielectric material. After the formation of the storage capacitor dielectric layers, a further polysilicon layer is formed over the exposed surfaces of the dielectric layers. This polysilicon layer forms the second of the two capacitor electrodes. At this stage, fabrication of the storage capacitor is substantially complete, at least for the purpose of the description of the invention, although in a practical DRAM device fabrication, subsequent process steps are still required, as persons skilled in the art appreciate. Because these fabrication details are not within the scope of the invention, they are not described herein.

Each of the above-described embodiments of the invention has a similar tree-trunk portion of the tree-shaped DRAM memory cell storage capacitor electrode, characterized by a horizontal section with a lower surface contacting the surface of the etching protection layer. A conventional photolithographic and etching procedure was performed to cut into the polysilicon layer covering the surface of the insulation layer to form multiple-sectioned cross-sectional configurations. The invention, however, is not limited to this specific type of configuration. A fifth embodiment of the invention, to be described below, has a tree-trunk portion of the tree-shaped DRAM memory cell storage capacitor electrode with a horizontal section, the lower surface of which is separated from the top surface of the etching protection layer. This arrangement effectively increases the electrode surface area of the capacitors, by making available some of the surface area of the underside of the tree-trunk portion. A CMP (chemical mechanical polish) procedure can also be performed to trim the tree-limb portion of the polysilicon layer in order to form a storage capacitor electrode having a specific crosssectional configuration.

Figure 6A:
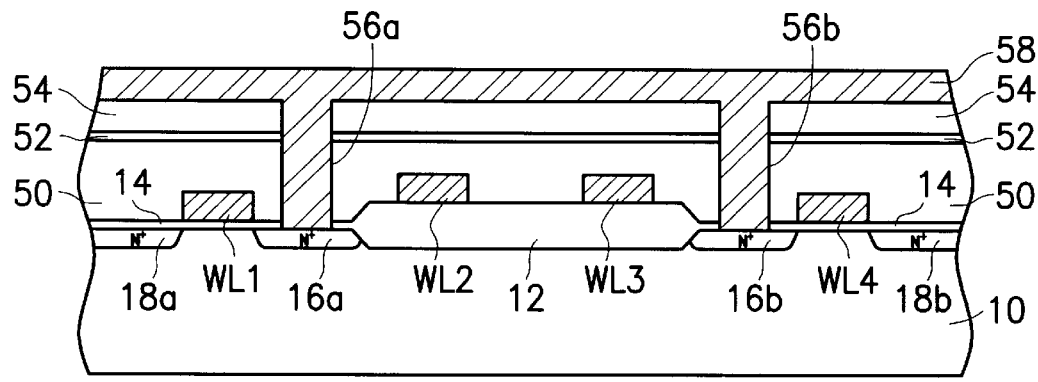
FIGS. 6A through 6C are cross-sectional views of a DRAM memory cell, depicting fabrication process stages in accordance with a fifth preferred embodiment of the invention.
Figure 6B:
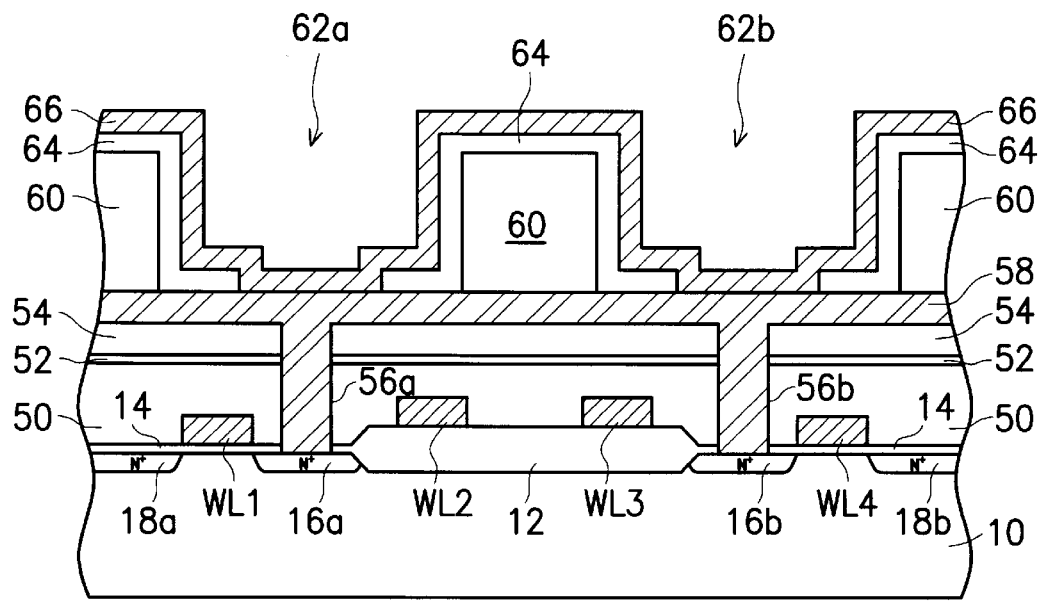
Figure 6C:
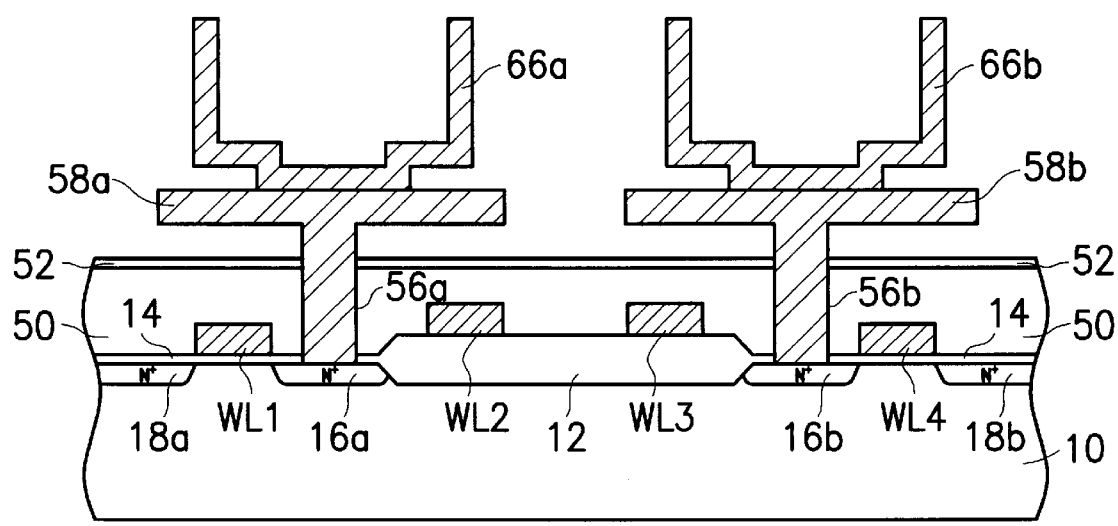

Referring to FIGS. 6A–6C for a description of the fifth preferred embodiment of the invention, it should be noted that the tree-type storage capacitor structural configuration is based on a semiconductor foundation similar to that of the embodiment shown in FIGS. 2A–2E. Essentially, the capacitors are fabricated according to the same procedural steps shown in FIGS. 2A until the structure depicted in FIG. 2A is formed. Further to that particular stage, different procedural steps are then performed to fabricate DRAM memory cell storage electrodes featuring a different tree-trunk configuration for the tree-shaped capacitor electrode structure. For clarity and simplicity, the same or equivalent structural portions of the memory cell configuration of this embodiment are designated by the same reference numerals as those of the first embodiment described above with reference to FIG. 2A.

After the formation of the wordlines WL1–WL4 over the surface of the device substrate as shown in FIG. 2A, an insulation layer 50, an etching protection layer 52, and another insulation layer 54 are formed in succession over the substrate surface, as shown in FIG. 6A. These three layers may be formed by CVD. For example, the insulation layer 50 may be a BPSG layer having a thickness of about 7,000 Å. The etching protection layer 52 may be a silicon nitride layer having a thickness of about 1,000 Å, and the insulation layer 54 may be a silicon dioxide layer also having a thickness of about 1,000 Å. After the formation of these three layers 50, 52, and 54, a conventional photolithographic and etching procedure is performed to etch into the insulation layer 54, the etch protection layer 52, the insulation layer 50, and the gate oxide layer 14, in order to form contact openings 56a and 56b for the storage capacitor electrode.

These contact openings 56a and 56b are formed from the top surface of the insulation layer 54 down to the exposed surface of the drain regions 16a and 16b of the memory cell transistors. Next, a polysilicon layer 58 is formed by deposition, completely filling the contact openings 56a and 56b and further covering the entire surface of the insulation layer 54, as shown in FIG. 6A. In order to improve the electrical conductivity characteristics of the polysilicon layer 58, ions such as arsenic can be implanted using an ion implantation procedure.

Refer next to FIG. 6B, a thick layer of insulation material is deposited over the surface of the polysilicon layer 58 by CVD. This layer may be a silicon dioxide layer having a thickness of about 7,000 Å. A conventional photolithographic and etching procedure is then performed to pattern the deposited thick insulation layer, forming the insulation cylinders 60 shown in the cross-sectional view. Recesses 62a and 62b are formed as a result of the formation of these insulation cylindrical layers 60. The recesses 62a, 62b are preferably located directly above the drain regions 16a and 16b of the transistor of the DRAM memory cell unit. Additional CVD is then performed to deposit another insulation layer 64 above the surface of the insulation cylinders 60 and the polysilicon layer 58. This insulation layer 64 may be a silicon dioxide layer, a silicon nitride layer, or an insulation layer of any other suitable material, and is preferably a silicon dioxide layer having a thickness of about 1,000 Å. A conventional photolithographic and etching procedure is then performed to pattern the insulation layer 64, in order to remove portions of the insulation layer 64 in the recesses 62a and 62b. CVD is then performed to deposit a polysilicon layer 66 having a thickness of about 1,000 Å over the surface of the insulation layer 64 and the exposed polysilicon layer 58. Ion implantation may then be performed to improve the electrical conductivity of the polysilicon layer 66 utilizing, for example, arsenic ions.

Referring next to FIG. 6C, a CMP procedure may then be performed to polish the polysilicon layer 66 until the top surfaces of the insulation cylindrical layers 64 are exposed. In this CMP procedure, the polysilicon layer 66 is physically sectioned into independent portions 66a and 66b, as shown in the drawing. A conventional photolithographic and etching procedure is then performed to pattern the polysilicon layer 58, so as to define the electrodes for the storage capacitor of the DRAM memory cell units. Sectioned polysilicon layers 58a and 58b are thus formed by this procedure. Next, similar to the previously-described embodiments, a wet etching procedure is employed to remove the insulation layers 60 and 64, as well as insulation layer 54, until the surface of the etching protection layer 52 is revealed. When the insulation layers 64, 60, and 54 are thus removed, a structural configuration shown in the cross-sectional view of FIG. 6C remains. At this point, the electrodes for the DRAM memory cell storage capacitors have been shaped. In this configuration, the bottom surfaces of the polysilicon layers 66a and 66b are directly in contact with the top surfaces of the polysilicon layers 58a and 58b, respectively. The combined configurations of polysilicon layers 66a and 66b and corresponding polysilicon layers 58a and 58b form a tree-shaped storage capacitor electrode structure. Again, each of the tree-trunk portions 58a and 58b has a T-shaped cross-section, as shown in the drawing, that extends downward to the drain regions 16a and 16b of the memory cell transistors. The bottom surfaces of the horizontal sections of the sectioned polysilicon layers 58a, 58b are left exposed, without contacting the etching protection layer 52 as in the previously-described embodiments. The raised portions of the sectioned polysilicon layers 66a and 66b extending above the surface of the substrate 10 are the tree-limbs of the tree-shaped storage electrode structure. This tree-shaped storage electrode structural configuration is characterized by the multiple bendings of the tree-limb portions. For example, the tree-limb section of the configuration, namely the sectioned polysilicon sections 66a and 66b, may be by analogy considered to be "growing" vertically upward from the sectioned polysilicon layers 58a and 58b and then extending outward in a horizontal direction. The structure then rises upward again. A total of three sections thus form each of the tree-limb portions in this embodiment.

As in the previously-described embodiments of the invention, exposed exterior surfaces of the sectioned polysilicon layers 66a, 58a, 66b, and 58b are covered with layers of dielectric material. After formation of the storage capacitor dielectric layers, a further polysilicon layer is formed over the exposed surface of the dielectric layers. This further polysilicon layer forms the second capacitor electrode. At this stage, fabrication of the storage capacitors is substantially complete, at least for the purpose of the description of the invention, although in a practical DRAM device fabrication, subsequent process steps are required, as persons skilled in the art appreciate. As these fabrication details are not within the scope of the invention, they are not described herein.

As persons skilled in the art should all be aware, the different storage capacitor electrode structural configurations for the DRAM memory cell units described above relating to the five exemplary embodiments may all be suitable for use in the fabrication of DRAM devices. Features of the embodiments can be mixed in any number, combination, and sequence, in the same device if desired.

While the invention has been described by way of example and in terms of preferred embodiments, it is to be understood that the invention is not limited to the disclosed embodiments. For example, although the drain structures of the DRAM memory cell transistor are disclosed as diffusion regions formed in the device substrate, other suitable drain structures, such as trenched drains, may also be utilized. Various modifications of the disclosed embodiments and similar arrangements will be apparent and are contemplated to be within the spirit and scope of the invention. The scope of the appended claims therefore, should be accorded the broadest interpretation so as to encompass all such modifications and similar arrangements.

What is claimed is:

1. A process for fabricating a semiconductor memory device, wherein said semiconductor memory device is fabricated on a semiconductor substrate and includes a transfer transistor and a storage capacitor, wherein the storage capacitor has a storage electrode that is electrically coupled to a source/drain region of the transistor, the process comprising the sequential steps of:

a. forming a first insulation layer over the substrate, covering the transfer transistor;

b. forming a first electrically conductive layer over the firs t insulation layer and penetrating the first insulation layer such that the first electrically conductive layer is electrically coupled to the source/drain region;

c. forming cylindrical structures over the first electrically conductive layer, such that a recess is formed between the cylindrical structures;

d. forming a second insulation layer conformally covering an upper surface and sidewalls of the cylindrical structures, and covering a portion of the first electrically conductive layer within the recess, such that an exposed surface of the first electrically conductive layer is not covered by the second insulation layer;

e. forming a second electrically conductive layer over the second insulation layer, including over the cylindrical structures and contacting the exposed surface of the first electrically conductive layer;

f. removing portions of the second electrically conductive layer above the cylindrical structures to form a sectioned second electrically conductive layer;

g. removing a portion of the first electrically conductive layer below the cylindrical structure to form a sectioned first electrically conductive layer;

h. removing the second insulation layer and the cylindrical structures;

i. forming a dielectric layer over the sectioned first and second electrically conductive layers; and j. forming a top electrically conductive layer over the dielectric layer;

wherein the storage electrode is a tree-shaped electrode, the sectioned first electrically conductive layer forms a tree-trunk portion of the tree-shaped electrode, the sectioned second electrically conductive layer forms a tree-limb portion of the tree-shaped electrode, and the top electrically conductive layer forms an opposing electrode of the storage capacitor.

2. The process of claim 1, wherein the tree-trunk portion of the tree-shaped electrode has a T-shaped cross-section.

3. The process of claim 1, wherein the tree-limb portion of tree-shaped electrode has a cross-section with multiple bends.

4. The process of claim 1, wherein said step f further includes etching the second electrically conductive layer.

5. The process of claim 4, wherein the tree-limb portion of the tree-shaped electrode includes first, second, third, and fourth sections, wherein the first section extends horizontally over the tree-trunk portion of the tree-shaped electrode for a first distance, terminating at an end; the second section extends vertically from the end of the first section for a second distance, terminating at an end; the third section extends horizontally from the end of the second section for a third distance, terminating at an end; and the fourth section extends vertically from the end of the third section for a fourth distance.

6. The process of claim 1, wherein said step f further includes removing a portion of the second electrically conductive layer by chemical mechanical polishing.

7. The process of claim 6, wherein the tree-limb portion of the tree-shaped electrode includes first, second, and third sections, wherein the first section extends vertically over the tree-trunk portion of the tree-shaped electrode for a first distance, terminating at an end; the second section extends horizontally from the end of the first section for a second distance, terminating at an end; and the third section extends vertically from the end of the second section for a third distance.

8. The process of claim 1, further comprising a step of forming an etching protection layer over the first insulation layer, after said step a and before said step b, and wherein the first electrically conductive layer formed in said step b further penetrates the etching protection layer.

9. The process of claim 1, further comprising:

d'. forming a third insulation layer over a portion of the second electrically conductive layer including above the second insulation layer, after said step e and before said step f, such that an exposed surface of the second electrically conductive layer is not covered by the third insulating layer;

e'. forming a third electrically conductive layer covering the third insulation layer and the exposed surface of the second conductive layer, after said step d' and before said step f; and f'. removing portions of the third electrically conductive layer above the cylindrical structures to form a sectioned third electrically conductive layer, after said step e';

wherein the tree-limb portion of the tree-shaped electrode includes a first tree-limb portion including the sectioned second electrically conductive layer, and a second tree-limb portion including the sectioned third electrically conductive layer.

10. The process of claim 9, wherein the tree-trunk portion of the tree-shaped electrode has a T-shaped cross-section.

11. The process of claim 9, wherein the tree-limb portion of the tree-shaped electrode has a cross-section with multiple bends.

12. The process of claim 9, wherein said step f further includes etching the second electrically conductive layer, and said step f' further includes etching the third electrically conductive layer.

13. The process of claim 12, wherein each of the tree-limb portions of the tree-shaped electrode includes first, second, third, and fourth sections, wherein the first section extends horizontally over the tree-trunk portion of the tree-shaped electrode for a first distance, terminating at an end; the second section extends vertically from the end of the first section for a second distance, terminating at an end; the third section extends horizontally from the end of the second section for a third distance, terminating at an end; and the fourth section extends from the end of the third section for a fourth distance.

14. The process of claim 9, wherein said step f further includes removing a portion of the second electrically conductive layer by chemical mechanical polishing, and said step f' further includes removing a portion of the third electrically conductive layer by chemical mechanical polishing.

15. The process of claim 14, wherein each of the tree-limb portions of the tree-shaped electrode includes first, second, and third sections, wherein the first section extends vertically above the tree-trunk portion of the tree-shaped electrode for a first distance, terminating at an end; the second section extends horizontally from the end of the first section for a second distance, terminating at an end; and the third section extends vertically from the end of the second section for a third distance.

16. The process of claim 9, further comprising a step of forming an etching protection layer over the first insulation layer, after said step a and before said step b, and wherein the first electrically conductive layer formed in said step b further penetrates the etching protection layer.

17. The process of claim 1, wherein said step c includes depositing a base insulation layer on the first electrically conductive layer, and then etching the base insulation layer to expose the first electrically conductive layer within the recess.

18. The process of claim 1, wherein said step c includes depositing a base insulation layer on the first electrically conductive layer, and then etching the base insulation layer, without etching the first electrically conductive layer, to expose the first electrically conductive layer within the recess.

19. The process of claim 1, wherein the cylindrical structures have a height above the first electrically conductive layer of about 7000 Å.

20. The process of claim 1, wherein said step e includes forming the second electrically conductive layer over the upper surface of the cylinder structures.

21. The process of claim 1, wherein said step g includes removing respective portions of the second insulation layer and the cylindrical structures.

22. The process of claim 5, wherein the fourth section terminates in an end, and wherein the tree-limb portion of the tree-shaped electrode includes a fifth section that extends horizontally from the end of the fourth section for a fifth distance.

23. The process of claim 9, further comprising removing the third insulation layer, after said step f'.

24. The process of claim 13, wherein the fourth section terminates in an end, and wherein the tree-limb portion of the tree-shaped electrode includes a fifth section that extends horizontally from the end of the fourth section for a fifth distance.

25. A process for fabricating a semiconductor memory device, wherein said semiconductor memory device is fabricated on a semiconductor substrate and includes a transfer transistor and a storage capacitor, wherein the storage capacitor has a storage electrode that is electrically coupled to a source/drain region of the transistor, the process comprising the steps of:

a. forming a first insulation layer over the substrate, covering the transfer transistor;

b. forming a first electrically conductive layer over the first insulation layer and penetrating the first insulation layer such that the first electrically conductive layer is electrically coupled to the source/drain region;

c. forming cylindrical structures over the first electrically conductive layer, such that a recess is formed between the cylindrical structures, wherein the cylindrical structures are formed by depositing a base insulation layer on the first electrically conductive layer, and then etching the base insulation layer to expose the first electrically conductive layer within the recess;

d. forming a second insulation layer conformally covering an upper surface and sidewalls of the cylindrical structures, and covering a portion of the first electrically conductive layer within the recess, such that an exposed surface of the first electrically conductive layer is not covered by the second insulation layer;

e. forming a second electrically conductive layer over the second insulation layer and contacting the exposed surface of the first electrically conductive layer;

f. removing portions of the second electrically conductive layer above the cylindrical structures to form a sectioned second electrically conductive layer, wherein a vertical portion of the sectioned second electrically conductive layer is longer than a horizontal portion of the sectioned second electrically conductive layer remaining above the cylindrical structure;

g. removing a portion of the first electrically conductive layer below the cylindrical structure to form a sectioned first electrically conductive layer;

h. removing the second insulation layer and the cylindrical structures;

i. forming a dielectric layer over the sectioned first and second electrically conductive layers; and j. forming a top electrically conductive layer over the dielectric layer;

wherein the storage electrode is a tree-shaped electrode, the sectioned first electrically conductive layer forms a tree-trunk portion of the tree-shaped electrode, the sectioned second electrically conductive layer forms a tree-limb portion of the tree-shaped electrode, and the top electrically conductive layer forms an opposing electrode of the storage capacitor.

26. The process of claim 25, wherein the tree-trunk portion of the tree-shaped electrode has a T-shaped cross-section.

27. The process of claim 25, wherein the tree-limb portion of tree-shaped electrode has a cross-section with multiple bends.

28. The process of claim 25, wherein said step f further includes etching the second electrically conductive layer.

29. The process of claim 28, wherein the tree-limb portion of the tree-shaped electrode includes first, second, third, and fourth sections, wherein the first section extends horizontally over the tree-trunk portion of the tree-shaped electrode for a first distance, terminating at an end; the second section extends vertically from the end of the first section for a second distance, terminating at an end; the third section extends horizontally from the end of the second section for a third distance, terminating at an end; and the fourth section extends vertically from the end of the third section for a fourth distance.

30. The process of claim 25, wherein said step f further includes removing a portion of the second electrically conductive layer by chemical mechanical polishing.

31. The process of claim 30, wherein the tree-limb portion of the tree-shaped electrode includes first, second, and third sections, wherein the first section extends vertically over the tree-trunk portion of the tree-shaped electrode for a first distance, terminating at an end; the second section extends horizontally from the end of the first section for a second distance, terminating at an end; and the third section extends vertically from the end of the second section for a third distance.

32. The process of claim 25, further comprising a step of forming an etching protection layer over the first insulation layer, after said step a and before said step b, and wherein the first electrically conductive layer formed in said step b further penetrates the etching protection layer.

33. The process of claim 25, further comprising:
  d'. forming a third insulation layer over a portion of the second electrically conductive layer including above the second insulation layer, after said step e and before said step f, such that an exposed surface of the second electrically conductive layer is not covered by the third insulating layer;
  e'. forming a third electrically conductive layer covering the third insulation layer and the exposed surface of the second conductive layer, after said step d' and before said step f; and
  f'. removing portions of the third electrically conductive layer above the cylindrical structures to form a sectioned third electrically conductive layer, after said step e';
  wherein the tree-limb portion of the tree-shaped electrode includes a first tree-limb portion including the sectioned second electrically conductive layer, and a second tree-limb portion including the sectioned third electrically conductive layer.

34. The process of claim 33, wherein the tree-trunk portion of the tree-shaped electrode has a T-shaped cross-section.

35. The process of claim 33, wherein the tree-limb portion of the tree-shaped electrode has a cross-section with multiple bends.

36. The process of claim 33, wherein said step f further includes etching the second electrically conductive layer, and said step f' further includes etching the third electrically conductive layer.

37. The process of claim 36, wherein each of the tree-limb portions of the tree-shaped electrode includes first, second, third, and fourth sections, wherein the first section extends horizontally over the tree-trunk portion of the tree-shaped electrode for a first distance, terminating at an end; the second section extends vertically from the end of the first section for a second distance, terminating at an end; the third section extends horizontally from the end of the second section for a third distance, terminating at an end; and the fourth section extends from the end of the third section for a fourth distance.

38. The process of claim 33, wherein said step f further includes removing a portion of the second electrically conductive layer by chemical mechanical polishing, and said step f' further includes removing a portion of the third electrically conductive layer by chemical mechanical polishing.

39. The process of claim 33, wherein each of the tree-limb portions of the tree-shaped electrode includes first, second, and third sections, wherein the first section extends vertically above the tree-trunk portion of the tree-shaped electrode for a first distance, terminating at an end; the second section extends horizontally from the end of the first section for a second distance, terminating at an end; and the third section extends vertically from the end of the second section for a third distance.

40. The process of claim 33, further comprising a step of forming an etching protection layer over the first insulation layer, after said step a and before said step b, and wherein the first electrically conductive layer formed in said step b further penetrates the etching protection layer.

41. The process of claim 25, wherein said step c includes depositing a base insulation layer on the first electrically conductive layer, and then etching the base insulation layer to expose the first electrically conductive layer within the recess.

42. The process of claim 25, wherein said step c includes depositing a base insulation layer on the first electrically conductive layer, and then etching the base insulation layer, without etching the first electrically conductive layer, to expose the first electrically conductive layer within the recess.

43. The process of claim 25, wherein the cylindrical structures have a height above the first electrically conductive layer of about 7000 Å.

44. The process of claim 25, wherein said step e includes forming the second electrically conductive layer over the upper surface of the cylinder structures.

45. The process of claim 25, wherein said step g includes removing respective portions of the second insulation layer and the cylindrical structures.

46. The process of claim 29, wherein the fourth section terminates in an end, and wherein the tree-limb portion of the tree-shaped electrode includes a fifth section that extends horizontally from the end of the fourth section for a fifth distance.

47. The process of claim 33, further comprising removing the third insulation layer, after said step f'.

48. The process of claim 37, wherein the fourth section terminates in an end, and wherein the tree-limb portion of the tree-shaped electrode includes a fifth section that extends horizontally from the end of the fourth section for a fifth distance.

* * * * *